United States Patent [19]

Schäfer

[11] 3,864,726

[45] Feb. 4, 1975

[54] CONTROLLABLE SEMICONDUCTOR RECTIFIER

[75] Inventor: Horst Schäfer, Zirndorf, Germany

[73] Assignee: Semikron Gesellschaft fur Gleichrichterbau und Elektronid m.b.H., Nurnberg, Germany

[22] Filed: July 30, 1973

[21] Appl. No.: 383,565

[30] Foreign Application Priority Data

July 28, 1972 Germany .......................... 2237086

[52] U.S. Cl. .............................................. 357/38

[51] Int. Cl. ....................... H01l 11/00, H01l 15/00

[58] Field of Search ................ 317/235 AB, 234 N

[56] References Cited

UNITED STATES PATENTS

| | | | |
|---|---|---|---|
| 3,408,545 | 10/1968 | De Cecco et al. | 317/235 |
| 3,434,023 | 3/1969 | Lesk | 317/235 |
| 3,489,962 | 1/1970 | McIntyre et al. | 317/235 |

*Primary Examiner*—Stanley D. Miller, Jr.
*Assistant Examiner*—Joseph E. Clawson, Jr.
*Attorney, Agent, or Firm*—Spencer & Kaye

[57] ABSTRACT

A controllable semiconductor rectifier device of the type having a monocrystalline semiconductor body having four layer-type zones of alternatingly opposite conductivity types with a portion of the one inner zone which serves as the base zone, and which portion is to support a control electrode, extending to the same major surface of the semiconductor body as the adjacent outer zone which serves as the emitter zone. A respective load current electrode ohmically contacts each of the two outer zones of the semiconductor body and the control electrode ohmically contacts the portion of the base zone which extends to the major surface. The emitter zone has a first section which is recessed from the major surface of the semiconductor body and extends to a first depth below the major surface of the semiconductor body and a second section, which is disposed at the edge of the first section at the major surface and extends to a second depth from the major surface of the semiconductor body, which second depth is less than the first depth. The respective load current electrode only contacts the first section of the emitter zone. The pn-junction which is formed by the edge section of the emitter zone and the base zone has a major portion lying in a plane substantially parallel to the major surface of the semiconductor body.

5 Claims, 4 Drawing Figures

CONTROLLABLE SEMICONDUCTOR RECTIFIER

BACKGROUND OF THE INVENTION

The present invention relates to an improved controllable semiconductor rectifier device having a monocrystalline semiconductor body with four layer-type zones of alternatingly opposite conductivity types, in which the two outer zones each have a contact electrode for the load current and the one inner zone which borders the outer zone serving as the emitter zone of the device is provided with a contact electrode for the control current.

When switching controllable semiconductor rectifier elements, so-called thyristors, from the nonconductive to the conductive state, also referred to as switching through, the increase in load current flowing from the anode to the cathode is known to initially be limited to a current path adjacent the control electrode due to the potential conditions resulting from the movement of the charge carriers. The cross section of the current path is determined substantially by that region of the emitter zone in which the emission of charge carriers into the adjacent base zone takes place as a result of the applied control current. This limitation of the cross section of the current flow path and the relatively slow propagation speed of the charge carrier emission over the emitter surface may lead to an undue specific load on this first current path when the load current is sharply increased. Moreover, due to the insufficient heat conduction property of the semiconductor material, this increase may result in undesirable local heating of the arrangement thereby causing it to malfunction.

The slow firing propagation speed is known to be the reason that in cases where the operating frequencies are about 1 kHz and above, the initial current path cannot be expanded to the available cross section of the current flow path during the conductive phase, and thus the current handling capability of the rectifier elements permitted at lower operating frequencies must be reduced.

In order to avoid these drawbacks, i.e., to increase the firing propagation speed or the so-called critical current rise speed *di/dt*, it is necessary that the charge carriers of the base zone, which travel to the emitter zone as a result of the application of the control pulse and excite the emitter zone into emission, be directed to as large an area of the emitter zone as possible.

In such devices, it is not possible to arbitrarily increase the firing current, without limitations, and in any case increases in the firing current do not lead to the desired switch-through behavior. This is particularly true in an arrangement utilizing a point-shaped control electrode disposed in an edge zone of the emitter surface, or outside thereof due to the fact that the charge carriers follow the path of the electrical field between the control electrode and the emitter contact, and preferably travel towards the closest region of the emitter contact.

Special embodiments are known for the control electrode and arrangements thereof with respect to the emitter zone, all of which result in a decrease in the emitter contact surface or in an increase in the size of the control electrode and thus do not meet the requirement for optimum current load carrying capability.

Thyristors, for example, are known which utilize so-called transverse field emitters. In such thyristors, the emitter contact electrode does not extend in the section adjacent the control electrode to the edge of the adjacent emitter zone, but instead ends at a considerable distance from the edge. The remaining, nonmetallized section of the emitter zone surface forms a limiting resistance for the control current flowing toward the emitter zone and that resistance causes a voltage drop. This voltage drop results in an electrical field which accelerates the propagation of the charge carrier emission and acts in the plane of the base zone.

Thyristors are also known in which the thickness of the portion of the adjacent base zone which is disposed below the emitter zone decreases with increasing distance from the nearest region of the control electrode. This arrangement is particularly utilized in devices where the emitter zone is produced by an alloying process and which have a central or annular control electrode.

Furthermore, thyristor embodiments are known in which the firing propagation is effected with the aid of an arrangement which is formed on the same semiconductor body and acts as an auxiliary thyristor. This auxiliary thyristor, which is fired in the usual manner via a control electrode, actuates the firing of the main thyristor by its anode current. With such an arrangement, a further contact electrode, whether or not it has a line connection, is required between the control electrode and the emitter zone and this further control electrode must be partially disposed on an additionally doped zone. For this reason the surface area of the emitter zone as well as of the emitter contact electrode must be reduced, which again prevents an optimum current carrying capability from being obtained.

SUMMARY OF THE INVENTION

An object of the present invention is to provide a controllable semiconductor rectifier device which avoids the above-mentioned drawbacks of prior known devices.

Another object of the present invention is to provide a controllable semiconductor rectifier device which exhibits an improved critical current rise speed and more favorable firing characteristics.

These objectives are accomplished in accordance with the present invention with the use of a controllable semiconductor rectifier device of the type including a monocrystalline semiconductor body having four layer-type zones of alternatingly opposite conductivity types in which the inner zone (base zone) borders on the outer zone which serves as the emitter zone of the device and a portion of the inner zone supports a control electrode and extends to the same major surface of the semiconductor body as the emitter zone. A respective load current electrode is disposed to ohmically contact each of the two outer zones and the control electrode ohmically contacts the portion of the base zone which extends to the major surface of the semiconductor body. The emitter zone has a first section which is recessed below the major surface of the semiconductor body and a second or edge section which is disposed at the edge of the first section and lies along the major surface of the semiconductor body. The depth to which this second section extends within the semiconductor body is less than the depth of the first section. The respective load current electrode only contacts the first section of the emitter zone. The edge section of the emitter zone and the base zone form a pn-junction which has its major portion lying in a plane substantially parallel to the major surface of the semiconductor body.

DESCRIPTION OF THE PREFERRED EMBODIMENTS

Figure 1:
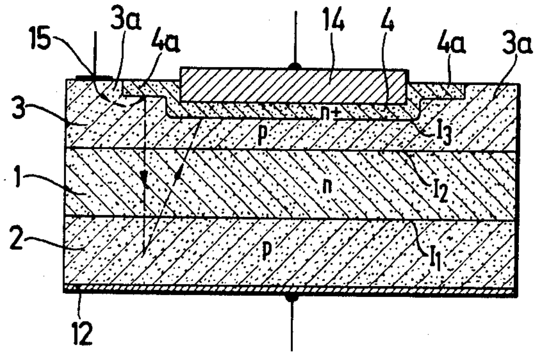
FIG. 1 is a cross-sectional view of one embodiment of a controllable semiconductor rectifier device according to the present invention.

Referring now to FIG. 1, there is shown a monocrystalline semiconductor body whose structure is based on a known sequence of three layer-type zones of alternatingly opposite conductivity type, i.e., a weakly doped, for example, n-conductive inner zone 1 and two higher doped p-conductive zones 2 and 3 which border the opposite surfaces of the inner zone 1. The zones 1, 2 and 3 form the two pn-junctions $I_1$ and $I_2$. The zone 3 which serves as the base zone provides the surface upon which a fourth highly doped zone 4 and the control electrode are provided. This fourth zone 4 serves as the emitter zone and has the opposite type of conductivity from the base zone 3.

The base zone 3 has an outer edge portion 3*a* which extends to the major surface of the semiconductor body and thus borders the emitter zone 4.

According to the present invention, the emitter zone 4 which is provided in the base zone 3, has an inner section serving for arrangement of a load current electrode and an edge section. While the edge section 4*a* lies along the major surface of the semiconductor body, the inner section of the emitter zone is recessed below the major surface.

The inner section of the emitter zone 4 extends to a first depth within the semiconductor body. The edge section 4*a* of the emitter zone 4, however, extends to a second depth within the semiconductor body, which depth is less than that of the inner section. Since this first depth is lower than the second depth, the pn-junction $I_3$ formed between the emitter zone 4 and the base zone 3 is lower in the region of this inner section than in the region of the edge section 4*a*. As can be seen in the figure, the pn-junction $I_3$ extends parallel to the plane of the base zone in the central region and then has two steps to reach the major surface of the base zone 3. Since the edge section 4*a* also has a constant thickness, the major surface of the pn-junction between this section and the base zone 3 lies substantially parallel to the major surface of the semiconductor body and the plane of the base zone.

The penetration depth of the emitter zone 4 in the base zone 3 is determined by the requirement that with the application of the highest permitted blocking voltage to the four-layer structure, the portion of the space charge zone of the pn-junction $I_2$ which widens in the base zone 3 will be sufficiently spaced from the pn-junction $I_3$ to avoid the so-called punch-through effect.

The recess 5 formed in the emitter zone 4 by the recessed arrangement of the emitter zone 4 in the base zone 3 serves to hold the contact electrode 14 which serves as the cathode, for example, and which is made of a metallic layer suitable to contact the semiconductor material, for example aluminum and/or silver and a contact plate, for example molybdenum. This contact electrode 14 only contacts this inner section of the emitter zone 4.

In order to complete the device, a control electrode 15 is provided on the edge section 3*a* of the base zone 3. In addition, the highly doped outer zone 2 is provided at its free surface with a contact electrode 12, which, for example, forms the anode.

The stepwise configuration of the emitter zone 4 can be made by a diffusion process and has the thickness usually encountered in known arrangements.

Since the edge region 4*a* of the emitter zone is not provided with a contact coating, it can end very close to the control electrode at a distance which is determined only by production considerations.

The width of the edge section 4*a* is determined, particularly in the region adjacent the control electrode, by the requirement for a charge carrier emission in the direction of anode 12 which emission is favorable for the firing process and is limited with respect to the entire area expanse by the requirement for optimum area utilization of the emitter zone for the current handling capability of the rectifier element.

A slight recessing of the inner contacted section of the emitter zone 4 contrary to the noncontacted edge region 4*a* by a few microns produces an improvement in the switch-through behavior of the device as compared to known arrangements. Favorable results have been achieved with a recess of, for example, 0.2 mil.

The improvement in the firing propagation in the device according to the present invention has resulted in a critical current rise speed which was increased at least by a factor 4 with respect to conventional arrangements.

The controllable semiconductor rectifier according to the present invention is fired in a conventional manner in that, with a voltage applied between electrodes 12 and 14, which is higher at electrode 12, the control electrode 15 is charged with a control pulse which is positive compared to the voltage at contact electrode 14. The electrical field produced between electrodes 15 and 14 causes holes to travel within the base zone 3 to the section of the pn-junction $I_3$ which is adjacent to the control electrode 15 and which is thus associated with the edge region 4*a*, so that this pn-junction is polarized in the forward direction.

Due to the accumulation of charge carriers at the portion of this section of pn-junction $I_3$, which is planarly directed toward anode 12 and is disposed in the vicinity of the control electrode, the pn-junction $I_3$ is caused to emit electrons. Due to the electrical field existing between cathode 14 and the anode 12, the electrons emitted by the pn-junction $I_3$ travel through the layer structure into zone 2 and cause this zone to emit holes, as illustrated in the drawing by the dotted line and arrows indicating the path of the charge carriers.

Due to the form of a path of current from the edge section 4*a* through the layer sequence to the anode zone 2, that section of the layer structure which is formed by the section of edge section 4*a* adjacent control electrode 15 and by its projection lines on the anode produces the desired improvement in the switch-through behavior. The anode current produced by emission from zone 2 in this section of the four-layer structure associated with the edge region 4*a*, and representing the firing current of the thyristor, does not flow to the edge region 4*a*. Rather, due to the rectifier arrangement according to the present invention, which results in a shortened path length for the charge carriers, which accordingly results in a reduction in the path resistance and due to the run of the electrical field existing between the electrodes 12 and 14, the anode current is directed to the section of the contacted inner section of the emitter zone 4 which is adjacent the control electrode and faces anode 12, i.e., the flow is substantially in a direction toward the central region of the emitter zone. Consequently, a larger portion of the emitter zone 4 is excited by this firing current so that the current load in the layer structure per unit area is reduced and thus a higher critical current rise speed can be realized.

The firing propagation is then effected by an increased emission from zones 2 and 4 so that the current input becomes more dependent upon the volume of the four-layer structure defined by the projection of the area of the emitter zone 4 contacted by the electrode 14 on the anode zone 2. Due to the shorter distance between the pn-junctions $I_3$ and $I_2$, lower firing values for the control electrode are required than in previously known arrangements.

Figure 2:
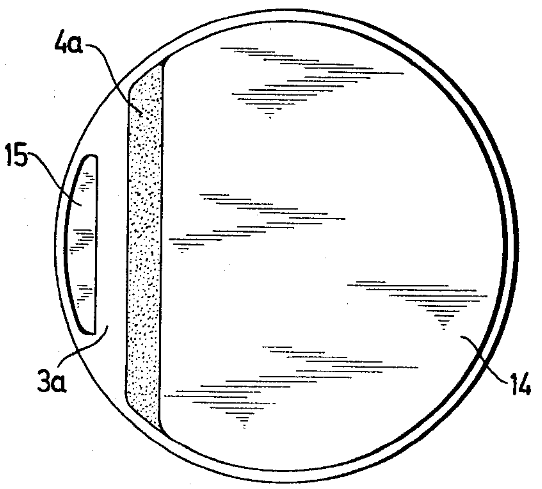
FIG. 2 is a top view of an other embodiment of a controllable semiconductor rectifier device according to the present invention.

In a modified embodiment of the present invention as shown in FIG. 2, the edge section 4*a* of the emitter zone 4 is limited to the section lying adjacent to the control electrode and the emitter zone 4 extends from this edge section 4*a* so as to completely cover the base zone 3 except for the portion 3*a*. The edge section 4*a* is spaced from the control electrode 15 by a portion of the base zone portion 3*a* and extends parallel therewith and forms nearly a segment of the base zone 3. The contact electrode 14 is conformingly arranged with the emitter zone 4.

Figure 3:
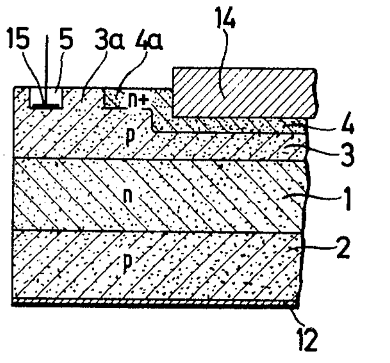
FIGS. 3 and 4 each show a cross-sectional view of the substantial part of other embodiments of controllable semiconductor rectifier devices according to the present invention.

In another modified embodiment of the present invention, the control electrode is inserted into a recess 5 in the base zone as shown in FIG. 3. This provides a further enrichment in holes of the pn-junction $I_3$ extending between the emitter zone 4 and the base zone 3 in the area adjacent to the control electrode. The layer sequence of this construction corresponds to that as shown in FIG. 1. The depth of the recess 5 is also determined by the concentration course of the doping impurity in the base zone 3 and by the distance to the section 4*a* of the emitter zone. This distance may favourably amount to 2 up to 20 mil. and the depth of the recess 5 is for example, 0.4 up to 0.6 mil.

Figure 4:
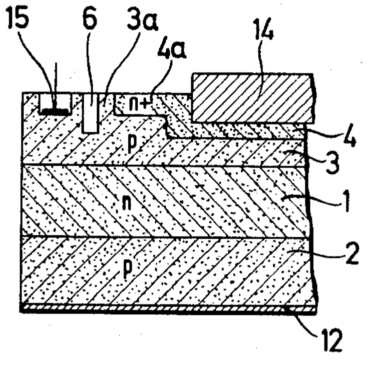

In order to further improve the firing behavior, the layer structure provided with such a recessed control electrode may advantageously be constructed according to the presentation in FIG. 4, with a slit-type recess 6 in the base zone between the control electrode 15 and the edge section 4*a*. The depth of this slit-type recess 6 is defined by the thickness of the edge region 4*a* as well as that of the recess 5 for the control electrode. The width of the slit-type recess 6, however, is defined only by production considerations. This slit-type recess is intended to serve to substantially prevent the flow of holes in the area of the edge region 4*a* from the control electrode to the side section of pn-junction $I_3$ adjacent to the major, or outer, surface of the base zone.

The slot-type recess 6 may run along the control electrode 15 at a constant distance from the same and with each extending to the edge of the semiconductor body.

In order to produce a device as proposed by the present invention a semiconductor wafer of, for example, n-type conductivity and having a suitable thickness, is subjected to a conventional diffusion process to produce a pnp layer sequence. Thereafter a recess is made in the major surface of the semiconductor body by an etching process with the aid of a masking layer. This recess is provided to receive the $n^-$-conductive emitter zone. In further process steps the masking layer is removed and the $n^-$-conductive zone, i.e, the emitter zone 4 including its edge section 4*a*, is produced by diffusion with the aid of a masking technique. Then the contact electrodes are applied and finally the layer sequence produced in this manner is subjected to a plurality of process steps to provide contact current leads, to stabilize the electrical and physical properties of the structure and to encapsulate the structure, these steps all being part of the state of the art.

In a typical embodiment according to the present invention, the recess formed in the emitter zone, has a depth of about 0.6 mil and a diameter of about 0.8 inches. The inner section of the emitter zone which is step-formed and deeply displaced, has a depth of about 0.4 mil. Further the edge section 4*a* of the emitter zone has a diameter of about 0.85 inches and a depth corresponding to the depth of the inner section, and the base zone 3 in its portion below the inner section of the emitter zone has a depth of about 2 mil.

The improvement of the critical current rise speed *di/dt* with a device according to the present invention amounts to 100 up to 150 percent compared with devices of a conventional structure.

It will be understood that the above description of the present invention is susceptible to various modifications, changes and adaptations, and the same are intended to be comprehended within the meaning and range of equivalents of the appended claims.

I claim:

1. In a controllable semiconductor rectifier device including: a monocrystalline semiconductor body having planar major outer surfaces and four layer-type zones of alternatingly opposite conductivity types with the one of the inner zones of said semiconductor body which serves as the base zone, and which is adjacent to the one of the outer zones of said semiconductor body which serves as the emitter zone of the device, having a portion thereof which extends to the same one of said major outer surfaces of said semiconductor body as said emitter zone; a respective load current electrode ohmically contacting each of the two outer zones of said semiconductor body; and a control electrode ohmically contacting said portion of said base zone, the improvement wherein: said emitter zone has a first section with a substantial portion of its major outer surface being recessed from said one major outer surface of said semiconductor body, said first section extending to a first depth below said one major outer surface of said semiconductor body, and (b) a second section disposed at least at the edge of said first section of said emitter zone adjacent said control electrode, said second section lying along said one major outer surface of said semiconductor body and extending to a second depth from said one major outer surface of said semiconductor body which is less than said first depth; said respective load current electrode contacting said emitter zone only contacts the recessed portion of said major outer surface of said first section of said emitter zone; and said second section of said emitter zone and said base zone form a pn-junction having a major portion lying in a plane substantially parallel to said one major outer surface of the semiconductor body.

2. A controllable semiconductor rectifier as defined in claim 1 wherein said second section is disposed completely around said first section.

3. A controllable semiconductor rectifier as defined in claim 1 wherein said control electrode contacts said portion of said base zone on one side of said emitter zone; said second section of said emitter zone is disposed only on the edge of said first section of said emitter zone adjacent said control electrode and said first section of said emitter zone completely covers said base zone adjacent said second section.

4. A controllable semiconductor rectifier as defined in claim 1 wherein said control electrode contacts said portion of said base zone at a location recessed from said one major outer surface of said semiconductor body.

5. A controllable semiconductor rectifier as defined in claim 1 wherein the section of said base zone, in the area between the location at which said control electrode is disposed and said emitter zone, is provided with a slit.

* * * * *